US006041080A

United States Patent [19]

Fraisse

[11] Patent Number: 6,041,080

[45] Date of Patent: Mar. 21, 2000

[54] SIGNAL PROCESSING SYSTEM AND METHOD FOR DIGITALLY MIXING A PLURALITY OF ANALOG INPUT SIGNALS

[75] Inventor: Christian Fraisse, Grenoble, France

[73] Assignee: SGS-Thomson Microelectronics S.A., Gentilly, France

[21] Appl. No.: 08/773,170

[22] Filed: Dec. 26, 1996

[30] Foreign Application Priority Data

Dec. 29, 1995 [FR] France .................................. 95 15861

[51] Int. Cl.[7] .......................... H04B 14/04; H04B 14/06; H03M 1/00; H03M 3/00

[52] U.S. Cl. .......................... 375/242; 375/247; 375/248; 341/110; 341/143; 341/146; 341/155; 370/537; 381/119; 381/80; 708/307; 708/313; 708/315

[58] Field of Search .................................... 375/242, 247, 375/316, 248; 341/110, 143, 61, 144, 122, 166, 146, 155; 332/100; 364/724.1; 327/254; 381/119, 80; 370/50, 295, 219, 343, 344, 480, 537; 708/307, 313, 315

[56] References Cited

U.S. PATENT DOCUMENTS

| | | | |
|---|---|---|---|
| 4,993,073 | 2/1991 | Sparkes | 381/119 |
| 5,208,594 | 5/1993 | Yamazaki | 341/143 |
| 5,621,345 | 4/1997 | Lee et al. | 327/254 |
| 5,621,805 | 4/1997 | Loh et al. | 381/119 |
| 5,627,536 | 5/1997 | Ramirez | 341/141 |
| 5,734,683 | 3/1998 | Hulkko et al. | 375/316 |
| 5,736,950 | 4/1998 | Harris et al. | 341/143 |

FOREIGN PATENT DOCUMENTS

| | | | |
|---|---|---|---|
| 2 552 958 | 4/1985 | France | H04N 5/22 |
| 33 46 500 | 4/1985 | Germany | H04N 7/00 |

OTHER PUBLICATIONS

French Search Report from French Patent Application No. 95 15861, filed Dec. 29, 1995.

*Primary Examiner*—Stephen Chin
*Assistant Examiner*—Michael W. Maddox
*Attorney, Agent, or Firm*—Wolf, Greenfield & Sacks, P.C.; James H. Morris; Theodore E. Galanthay

[57] ABSTRACT

A signal processing system receives and mixes a plurality of analog input signals having a maximum frequency. Each analog input signal is connected to an input of a modulator producing a high frequency oversampled digital signal. Each high frequency oversampled signal is connected to an input of a first decimation filter which produces an intermediate frequency oversampled multiple bit signal. Each of the intermediate frequency oversampled signals is connected to a respective input of a first digital mixer which produces a single mixed multiple bit output signal. The single mixed multiple bit output signal is connected to a second decimation filter which produces a final digital output signal, at a frequency suitable for representing the mixed analog input signals.

30 Claims, 6 Drawing Sheets

SIGNAL PROCESSING SYSTEM AND METHOD FOR DIGITALLY MIXING A PLURALITY OF ANALOG INPUT SIGNALS

BACKGROUND OF THE INVENTION

1. Field of the Invention

The invention relates to mixing and digital conversion of several analog signals, in particular in so-called 'multimedia' computer systems, where input analog signals, for example audio signals, arrive from a variety of sources and are later exploited digitally.

2. Discussion of the Related Art

FIG. 1 shows a conventional signal processing system suitable for use in multimedia applications. The circuit is arranged as an input path 2, an output path 4 and a feedback path 6. A number of analog input signals I1, I2, I3, I4 are each connected to a corresponding variable gain analog amplifier G1, G2, G3, G4. Each of these amplifiers G1–G4 may provide a level of amplification or attenuation, according to a control signal which may be supplied by a host microprocessor 10, using a data or command bus 20. The amplified or attenuated signals I1', I2', I3', I4' are each supplied by the respective amplifier to a respective mute circuit M1, M2, M3, M4. The mute circuits M1–M4 are also controlled by the data or command bus 20. The outputs of the mute circuits M1–M4 are connected as inputs to a first analog mixer 22. The output of the analog mixer 22 is connected to an analog-to-digital converter 24, whose output is connected to a data bus 26.

The digital signals from analog-to-digital converter 24 are the mixed and digitally converted representation of all the input signals I1, I2, I3, I4, according to ratios set by the amplification or attenuation of amplifiers G, and according to the passing or blocked state of mute circuits M1–M4.

The data bus 26 is also connected to the input terminals of a digital-to-analog converter 28. The output of the digital-to-analog converter 28 is connected to an input of a mute circuit M5. The output of this mute circuit M5 is connected to a second analog mixer 32. This second mixer also receives signals I1', I2', I3', I4' via mute circuits M1', M2', M3', M4', which are controlled by data or command bus 20. The output of mixer 32 is supplied to a variable attenuator A, which attenuates the signal from the mixer 32 to a level suitable for provision as an output signal O. Variable attenuator A is controlled by data or command bus 20. Output signal O is provided to a mute circuit M6, whose output is connected as an input to first mixer 22.

Each mute circuit is operable to either pass the signal present at its input, or to block this signal and provide no analog signal as an output. The analog mixer circuits 22, 32 act as adders, and add together the connected input signals. This is done in the analog domain, and the resulting mixed signal is converted to a digital representation later.

The digital representation of the output of the analog mixer 22 may then be subjected to any required signal processing operations by the microprocessor 10.

Before being supplied as an output signal O. the digital representation is converted back to an analog form by digital-to-analog converter 28, and may be mixed with a selection of the input signals, chosen by selecting the states of mute circuits M1', M2', M3', M4'. By placing mute circuit M5 in its blocking state, an output signal O comprising a mixed version of one or more input signals I1, I2, I3, I4 may be supplied, without the use of the digitally represented signal.

By placing mute circuit M6 in its passing state, the output signal O may be fed back into mixer 22 for further processing.

As the input signals I1 to I4 may be provided by different sources, the gain or attenuation of each amplifier G1 to G4 must be individually adjusted, to ensure that each signal I1'–I4' is at an adapted level for the mixer 22 and the analog-to-digital converter 24, to avoid exceeding the maximum input of the converter 24.

The variable attenuator A is required to ensure that the output signal O is at a suitable level for the circuitry which receives it. It also allows the output signal O to be fed back into the first mixer 22 without drowning out the other signals I1' to I4'.

Gain control and mixing of the signals is done in the analog domain. The dynamic range of this circuit is limited, both by the supply voltage to the mixer, and the full scale range of the analog-to-digital converter 24. This is a problem when several signals are summed together, hence the need for the variable gain amplifiers G1–G4. Also, these variable gain amplifiers G1–G4 ensure that a strong signal (e.g. an electronic keyboard output) does not drown out a weaker signal (such as a signal from a microphone). Noise is generated by each circuit block, and is added by the mixer 22, so that the total noise content of the signal produced by the mixer 22 may be very high. This noise cannot be filtered out, and can cause errors greater than the quantization level of the digital conversion. Zero crossing detection of signals is desirable for performing gain control, but is difficult to perform in the analog domain. Crosstalk between several analog signals all being treated on a same integrated circuit is often also a problem. This may be directly between signals, or via supply lines.

Furthermore, it may be desirable to cancel the DC offset of each signal before performing gain control. This also is difficult to perform in the analog domain.

An object of the invention is to provide a processing and mixing circuit for a number of analog signals, which occupies a particularly small semiconductor surface area.

Another object of the invention is to provide such a circuit which may avoid or reduce the problems of crosstalk, zero crossing detection, DC offset cancellation, gain control and dynamic range limitation.

SUMMARY OF THE INVENTION

In one illustrative embodiment of the invention, a signal processing system is provided, receiving a plurality of analog input signals having a maximum frequency and effecting mixing of the analog input signals. Each analog input signal is connected to an input of a modulator, producing a high frequency oversampled digital signal. Each high frequency oversampled signal is connected to an input of a first decimation filter which produces an intermediate frequency oversampled multiple bit signal. Each of the intermediate frequency oversampled signals is connected to a respective input of a first digital mixer, which produces a single mixed multiple bit output signal. Furthermore, the single mixed multiple bit output signal is connected to a second decimation filter which produces a final digital output signal, at a frequency suitable for representing the mixed analog input signals.

In an embodiment of the invention, the signal processing system comprises a gain control circuit acting on each intermediate frequency oversampled signal between the first decimation filter and the first digital mixer.

In an embodiment of the invention, each first decimation filter comprises a convolution circuit acting on the respective high frequency oversampled signal, and receiving a sequence of impulse response coefficients common to all convolution circuits.

In an embodiment of the invention, the sequence of impulse response coefficients is stored in a common memory.

In an embodiment of the invention, the convolution circuit produces the intermediate frequency oversampled signal by summing coefficients corresponding to 1's of the high frequency oversampled signal, and subtracting coefficients corresponding to 0's of the high frequency oversampled signal.

In an embodiment of the invention, the signal processing system further comprises an interpolation filter connected to receive the final digital output signal and producing an interpolated signal; a second digital mixer receiving the interpolated signal, and at least one other digital signal, and producing an interpolated mixed digital signal; and a digital-to-analog converter receiving the interpolated mixed digital signal.

In an embodiment of the invention, the digital-to-analog converter comprises a low pass filter receiving the interpolated mixed digital signal and producing a one bit serial output, and a low pass filter which filters the one bit serial output.

In an embodiment of the invention, a mute circuit is placed before at least one input of a digital mixer.

An embodiment of the invention is directed to a method of signal processing, comprising the steps of performing modulation on at least two analog signals to produce a high frequency oversampled digital signal for each analog signal, performing a first digital filtering operation on each high frequency oversampled digital signal, to produce intermediate frequency oversampled multiple bit signals, performing a digital mixing operation of the intermediate frequency oversampled signals to produce a mixed signal at the intermediate frequency, and performing a second digital filtering operation on the mixed signal, to produce a final digital output signal, at a frequency suitable for representing the analog signals.

In at least one variant of the signal processing method according to an embodiment of the invention, offset and zero crossing detection are performed between the first filtering and the digital mixing.

BRIEF DESCRIPTION OF THE DRAWINGS

These and other characteristics and advantages of the present invention will be described in detail in the following description of certain, non-limiting, embodiments of the invention with reference to the drawings, in which.

DETAILED DESCRIPTION

Figure 1:
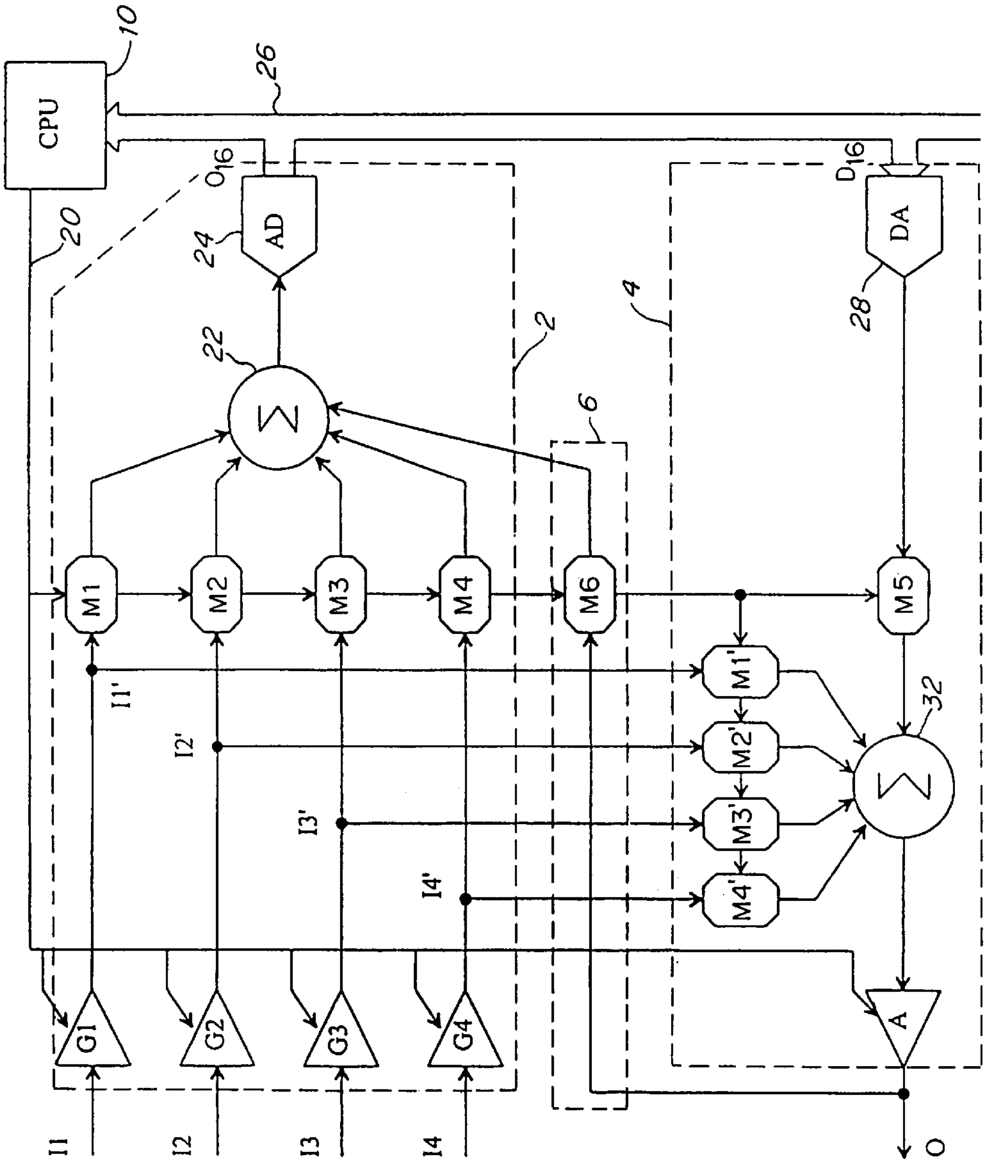
FIG. 1 shows an analog signal processing system of the prior art.

An aspect of the present invention relates to digital treatment of a signal, which for gain control, DC offset cancellation, zero crossing detection and mixing may avoid many of the problems encountered in an analog processing circuit, such as that shown in FIG. 1.

Thus, in accordance with a first aspect of the invention, the functions of the circuit of FIG. 1 are performed in the digital domain to overcome the above mentioned problems. Gain control of a digital signal is a simple multiplication or division operation, and does not introduce analog noise. Zero crossing detection of a digitized signal represented by a signed integer may simply be the detection of a change in the sign bit. Mixing of digitized signals is a simple addition operation, which also does not introduce analog noise. The dynamic range of the mixer circuit is not limited by circuit supply voltage, but only by the number of bits chosen for the digital representation.

A circuit to convert the analog. input signals I1–I4 of FIG. 1 into digital representations may therefore be advantageously applied. To provide a dedicated analog-to-digital converter for each analog input signal, however, might occupy a large semiconductor surface area.

A second aspect of the invention is directed to a particular type of analog-to-digital converter having a portion of circuitry which can be shared between all the input signals, so that the analog-to-digital conversion circuitry dedicated to each input may be less complex.

Figure 2:
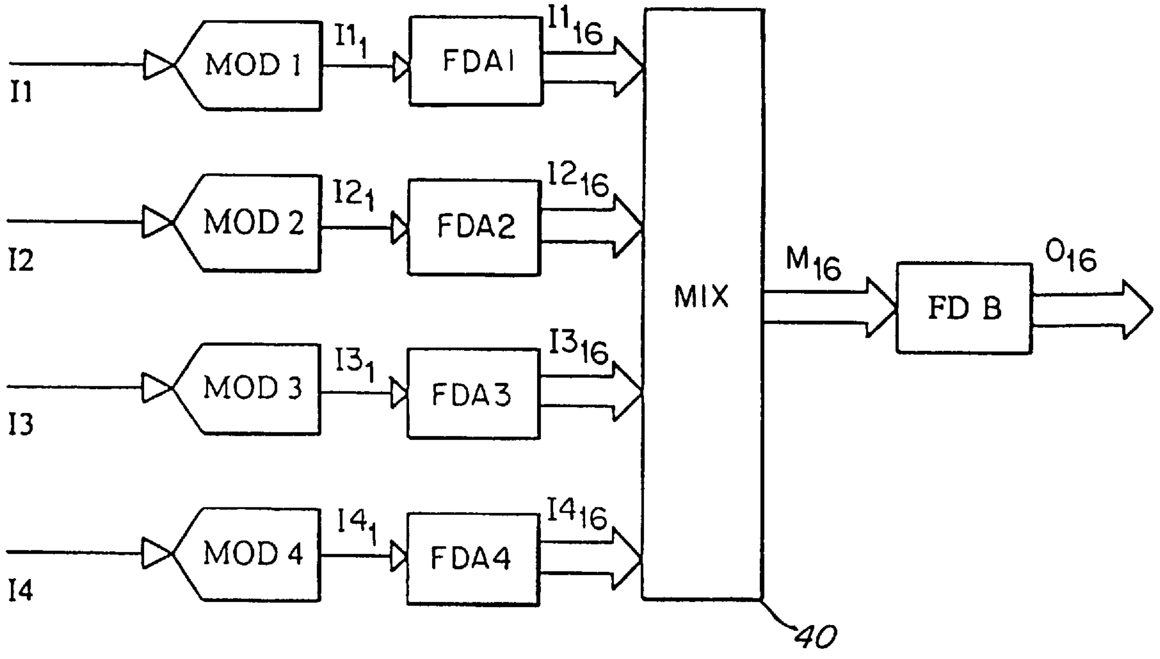
FIG. 2 shows an architecture of an embodiment of a signal processing system according to the present invention.

FIG. 2 shows an analog to digital conversion and signal mixing circuit according to this second aspect of the present invention. The circuitry of FIG. 2 replaces the circuitry of the input path 2 in FIG. 1. Common elements in both these figures carry common reference labels. A sigma-delta conversion scheme appears to be particularly well adapted to the present invention. Such schemes are relatively simple, and their implementation requires less semiconductor surface area than other conversion schemes.

In an illustrative embodiment of the invention, the analog input signals I1–I4 are each supplied to a respective sigma-delta modulator MOD1–MOD4. These modulators each produce a low bit width digital signal $\mathbf{I1}_1$–$\mathbf{I4}_1$, which represents the respective analog signal, according to known sigma-delta techniques. These low bit width signals are at a high oversampling frequency, such as 256*FA, where FA is the maximum frequency of the analog input signal. For an audio signal having a maximum frequency of 22 kHz, the oversampling frequency may be 5.63 MHz. The oversampling ratio is chosen according to a required signal-noise ratio in the signal frequency band, to the order and topology of the modulators MOD and to the number of bits used. Preferably, a one bit oversampled signal is used, but a conventional multiple bit modulation could be used.

The high frequency, one bit signals $\mathbf{I1}_1$–$\mathbf{I4}_1$, are applied to respective first decimation filters FDA1–FDA4, which may be finite impulse response filters. These filters FDA1–FDA4 perform filtering and frequency decimation for providing multiple bit parallel output signals $\mathbf{I1}_{16}$–$\mathbf{I4}_{16}$ at an intermediate oversampling frequency. In this example, 32nd order decimation is used, and 16-bit wide parallel output signals are produced. The output signals $\mathbf{I1}_{16}$–$\mathbf{I4}_{16}$ will then be at an oversampling frequency of 8*FA, or 176 kHz for audio signals.

According to an embodiment of the invention, the intermediate frequency signals I116–$\mathbf{I4}_{16}$ are all supplied to a single digital mixer 40. This mixer 40 produces a mixed digital parallel output signal $M_{16}$ at the intermediate frequency, comprising a sum of the intermediate frequency signals $I1_{16}$–$I4_{16}$. The mixed signal $M_{16}$ is supplied to a second common decimation filter FDB, which may, for example, be a finite impulse response filter or an infinite impulse response filter. This second decimation filter completes the analog-to-digital conversion started by each modulator MOD and decimation filter FDA by performing further filtering and decimation. It produces an output signal $O_{16}$ at the Nyquist frequency 2*FA (44 kHz for the audio signal), and complements the transfer function of each filter FDA to achieve a required overall transfer function. The use of two separate but complementary filters is in some instances preferred since it enables a sharp cutoff to be achieved, while avoiding distortion in the analog signal frequency band.

An advantage of this architecture is that any crosstalk that occurs between input signals is at the high oversampling frequency 256*FA, and will be filtered out by filters FDA.

Each first decimation filter FDA may be realized conventionally as a multistage, multi-frequency circuit, but is realized in one embodiment as a circuit producing a convolution product of its input signal $I1_1$ with predetermined impulse response coefficients, as will be discussed below, in relation to an advantageous embodiment of the invention.

In one embodiment of the invention, the second decimation filter FDB is more complex than the first decimation filters FDA1–FDA4. The first decimation filters FDA1–FDA4 operate on high frequency signals, and are designed to perform a simple filtering operation, while not significantly attenuating signals in the analog signal frequency band. These filters FDA1–FDA4 do not have a sharp cutoff in at least one embodiment of the invention.

Second decimation filter FDB may be designed to have a flat frequency response at frequencies of the analog signals, and a sharp cutoff. It may also compensate for any attenuation of analog signal frequencies introduced by filters FDA1–FDA4.

Figure 3A:
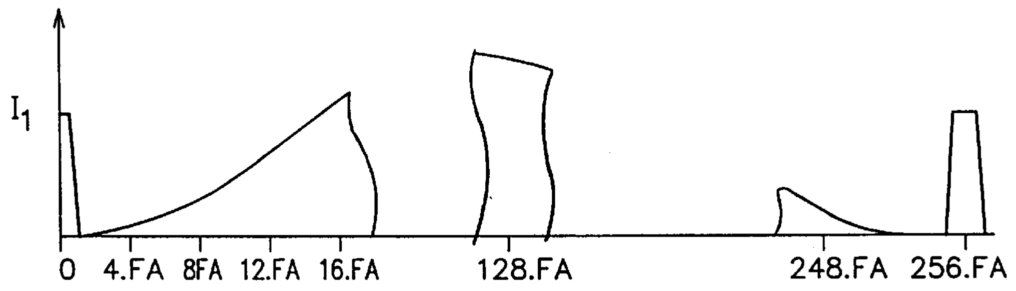
FIGS. 3(*a*), 3(*b*), and 3(*c*) show frequency spectra of various signals of FIG. 2.
Figure 3B:
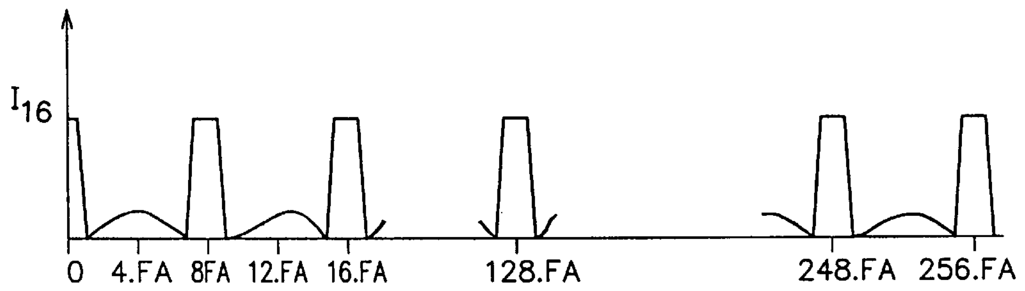
Figure 3C:
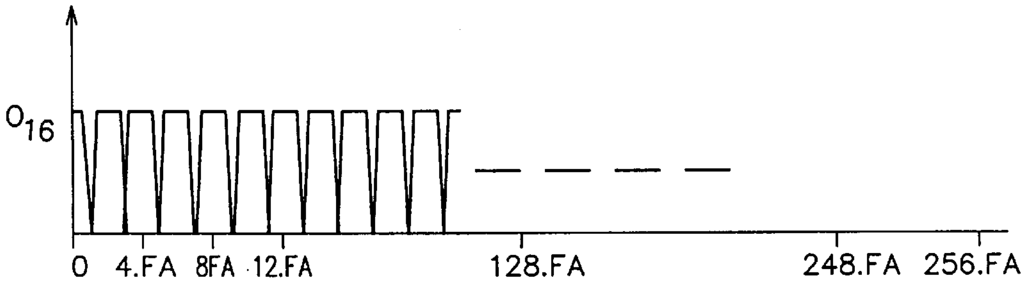

FIGS. 3(*a*), 3(*b*), and 3(*c*) show frequency spectra of the signals of FIG. 2. The signal $I_1$ ($I1_1$–$I4_1$) produced by each modulator MOD has the spectrum of the analog signal present between 0 Hz and FA as shown in FIG. 3(*a*). A corresponding spectrum is also modulated around the oversampling frequency 256*FA, and a noise spectrum in between rises at 15 dB/octave to a peak at half the oversampling frequency. This spectrum is characteristic of sigma-delta conversion and of the type of modulator used. A second order sigma-delta modulator may be preferred, as this introduces little noise at the analog signal frequencies.

The first decimation filter FDA acts to eliminate this noise spectrum. In one embodiment, it attenuates better than −15 dB/octave to overcome the noise spectrum which, after decimation, would be folded back into the signal frequency band. Therefore a third order filter may be used, which 1attenuates noise frequencies at −18 dB/octave. This filter may be a linear finite impulse response filter. In one embodiment, it has a transfer function of the type $(\sin x/x)^3$, which is known as $SINC^3$ filtering.

As shown in FIG. 3(*b*), the spectrum of output signal $I_{16}$ ($I1_{16}$–$I4_{16}$) of each filter FDA comprises the spectrum of the analog signal from 0 Hz to FA, and of the analog signal modulated around the intermediate frequency, 8*FA, and around harmonics thereof. Although the noise spectrum of signal $I_1$ has been eliminated by filter FDA, a smaller noise spectrum is introduced between each harmonic by the operation of filter FDA.

The output signal of mixer 40 conforms to the spectrum of $I_{16}$.

Second decimation filter FDB eliminates unwanted noise and harmonics. The spectrum of its output signal $O_{16}$ comprises the spectrum of the analog signals modulated around the Nyquist frequency 2*FA, and around harmonics thereof. Practically no noise spectrum is folded back into the signal frequency band.

The decimation order and architecture of the filters FDA, FDB is a design choice, but with the following constraints.

As shown in FIG. 3(*c*), the signal $O_{16}$ may be at the Nyquist frequency, 2*FA, to allow maximum efficiency of coding and transmission. Input samples to filter FDB may be relatively slow, to allow the required complex digital processing to be carried out. In the example, filter FDB performs 26 multiplications for each sample of the signal $M_{16}$. Each of these calculations may require several clock cycles to complete, so that filter FDB has a fixed maximum operating speed. This maximum operating speed determines the frequency of the input signal $M_{16}$, and thus also defines the necessary decimation order of filters FDA. Too slow an input frequency to filter FDB would, however, require high order first decimation filters FDA, which may cause signal distortion if a simple filter architecture is used.

Offset cancellation may require an average of each of signals $I_{16}$ to $I4_{16}$ over a relatively long time period, such as 20 ms, this average being subtracted from the respective signal $I1_{16}$–$I4_{16}$. The related circuitry may either be within the mixer 40 or in first decimation filters FDA. The calculations for filters FDA, FDB may be carried out by a dedicated calculation unit, due to the complexity of the calculations.

Alternatively, the digital mixer, gain control, offset cancellation and zero crossing detection circuitry may all be included in a dedicated calculation unit shared by all the input channels. At the mixer 40, the data arrives at the intermediate frequency, which may be slow enough for these operations, which are all classic binary arithmetic operations, to be easily carried out.

Figure 4:
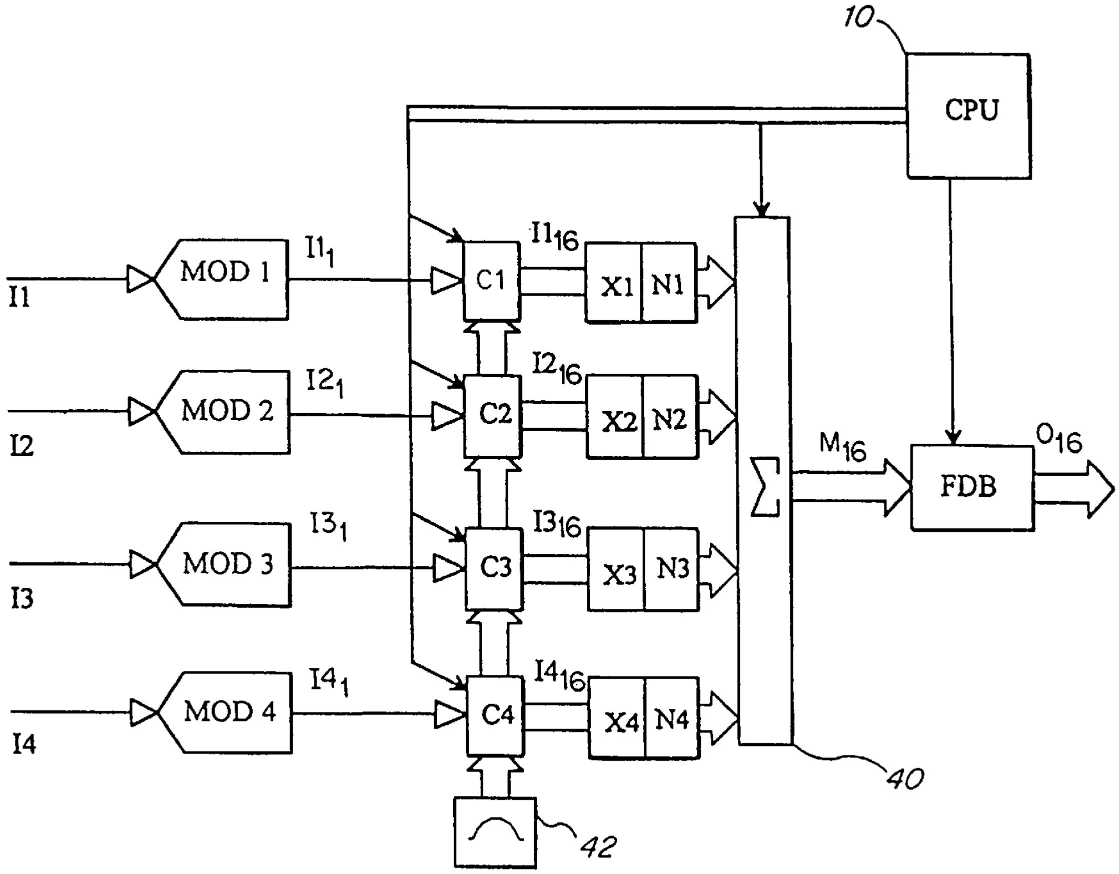
FIG. 4 shows an architecture of an advantageous embodiment of a signal processing system according to the present invention.

FIG. 4 shows a signal mixing and conversion system according to an embodiment of the invention.

First decimation filters FDA1–FDA4 are realized in this embodiment as calculation circuits C1–C4, which each produces a convolution product of a respective incoming signal $I_1$ with impulse response coefficients. This performs the filtering and decimation described above by producing a sliding average of a large number of consecutive bits of signal $I_1$, weighted according to the coefficients. In an example, 128 bits of $I_1$ are used to calculate each value of signal $I_{16}$, and this calculation is performed every 32 cycles of signal $I_1$.

The finite impulse response coefficients are in some instances difficult to calculate, and the circuitry required to calculate them might occupy a large surface area and consume a considerable amount of current. Advantageously, the coefficients are stored in a common non-volatile memory 42. Each calculation circuit C1–C4 receives these coefficients and a respective signal $I_1$. Conventionally, the '1' states of signal $I_1$, may be affected with a value of +½ and the '0' states may be affected with a value of −½. Thus, the calculation units simply sum all coefficients corresponding to 1's and subtract coefficients corresponding to 0's. The result is the next value of signal $I_{16}$.

In one embodiment, the operations performed by calculation circuits C1–C4 are very simple, so the calculation circuits C1–C4 may be very small, or one single calculation circuit may be used for all signal paths $I1_1$–$I4_1$, $I1_{16}$–$I4_{16}$. Only one non-volatile memory 42 need to be included for all the analog input signals, as each of them is subjected to the same filtering.

As shown in the example of FIG. 4, the values of signal $I_{16}$ are each subjected to gain control by a respective gain control circuit X1–X4, and passed through a mute circuit N1–N4. The gain control circuits may simply be digital multipliers, multiplying each value of signal $I_{16}$ by a factor supplied by microprocessor 10. The mute circuitry may simply be a multiplexer which passes either a value present at its input, or a null value.

The mixed signal $M_{16}$ supplied by mixer 40 then comprises a sum of the signals $I1_{16}$–$I4_{16}$, in proportion to the gain of the respective amplification blocks X1–X4, and according to the states of mute circuits N1–N4.

Figure 5:
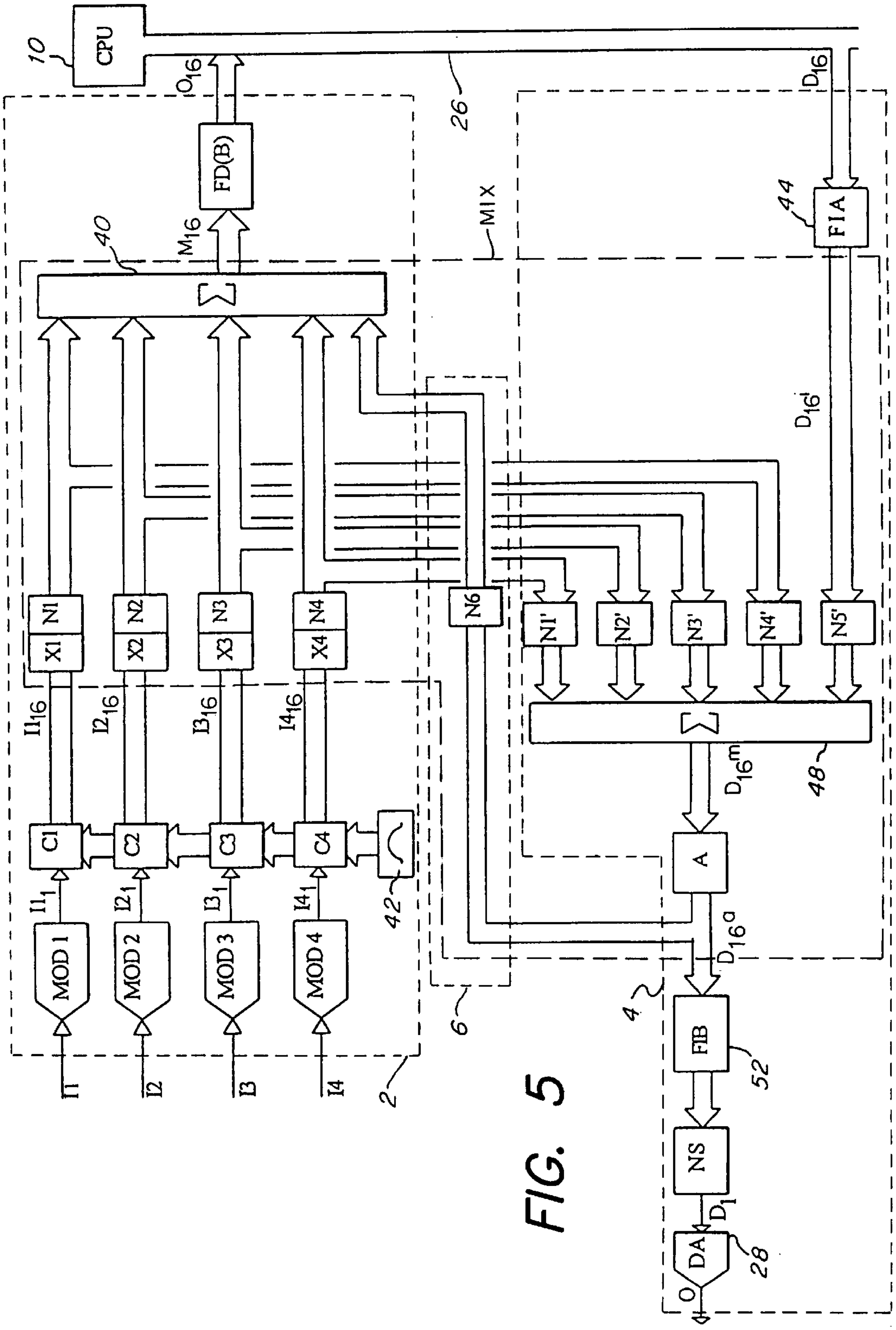
FIG. 5 shows an architecture of another embodiment of a signal processing system according to the present invention.

FIG. 5 shows a circuit according to an embodiment of the invention, which may be used to replace the conventional analog circuitry of FIG. 1. Elements common with other drawings share common reference labels. Connections of data or control bus 20 to various circuit blocks are not shown, for clarity.

An input path 2, an output path 4 and a feedback path 6 are provided, as for the circuit of FIG. 1.

Digital conversion, decimation and filtering circuitry contained in the input path 2 corresponds to the circuitry of FIG. 4.

Output path 4 comprises digital-to-analog conversion circuitry, and circuitry complementary to that of the input path. A multiple bit digital signal $D_{16}$ is present on data bus 26. This may correspond to the digital output signal $O_{16}$ of the input path 2, or may come from another source, such as a compact disc player. This digital signal is provided to a first interpolation filter FIA 44, producing an interpolated signal $D_{16}i$, at the intermediate frequency 8*FA. This interpolated signal is passed through a mute circuit N5' to an input of a second digital mixer 48. The gain controlled multiple bit signals $I1_{16}$–$I4_{16}$ are supplied from the input path 2 to other inputs of the digital mixer 48, through corresponding mute circuits N1'–N4'.

In the example illustrated, a second digital mixer 48 produces a mixed multiple bit output signal $D_{16}m$ to a variable attenuator A. This attenuator produces an attenuated multiple bit digital signal $D_{16}a$ to feedback path 6 and to a second interpolation filter FIB 52. The attenuator attenuates to a level suitable to provide a feedback signal of a required level, and also suitable for conversion to an analog output signal.

Second interpolation filter FIB produces a sixteen bit digital output signal at the oversampling frequency 256*FA. This oversampled signal is processed by a digital modulator NS, known as a “noise shaper”, which has the same transfer function as modulators MOD and providing, in a similar fashion, a single bit signal D, at the same oversampling frequency 256*FA and having a frequency spectrum similar to that of signal $I_1$ in FIG. 3.

The digital signal $D_1$ is supplied to a digital-to-analog converter DA 28, which supplies analog output signal O. For converting a sigma-delta coded signal, the digital-to-analog converter 28 is a single bit converter followed by a low-pass filter.

In the treatment of audio, stereo signals are often used. In such cases, the circuitry of FIG. 5 may be repeated for both left and right channels. However, only one set of coefficients need be stored in the common non-volatile memory 42 and a single calculation unit is used for the two channels.

At least one embodiment of the invention allows required mixing and conversion functions to be realized in an integrated circuit using much less space than was necessary for comparable analog signal processing systems.

Figure 6:
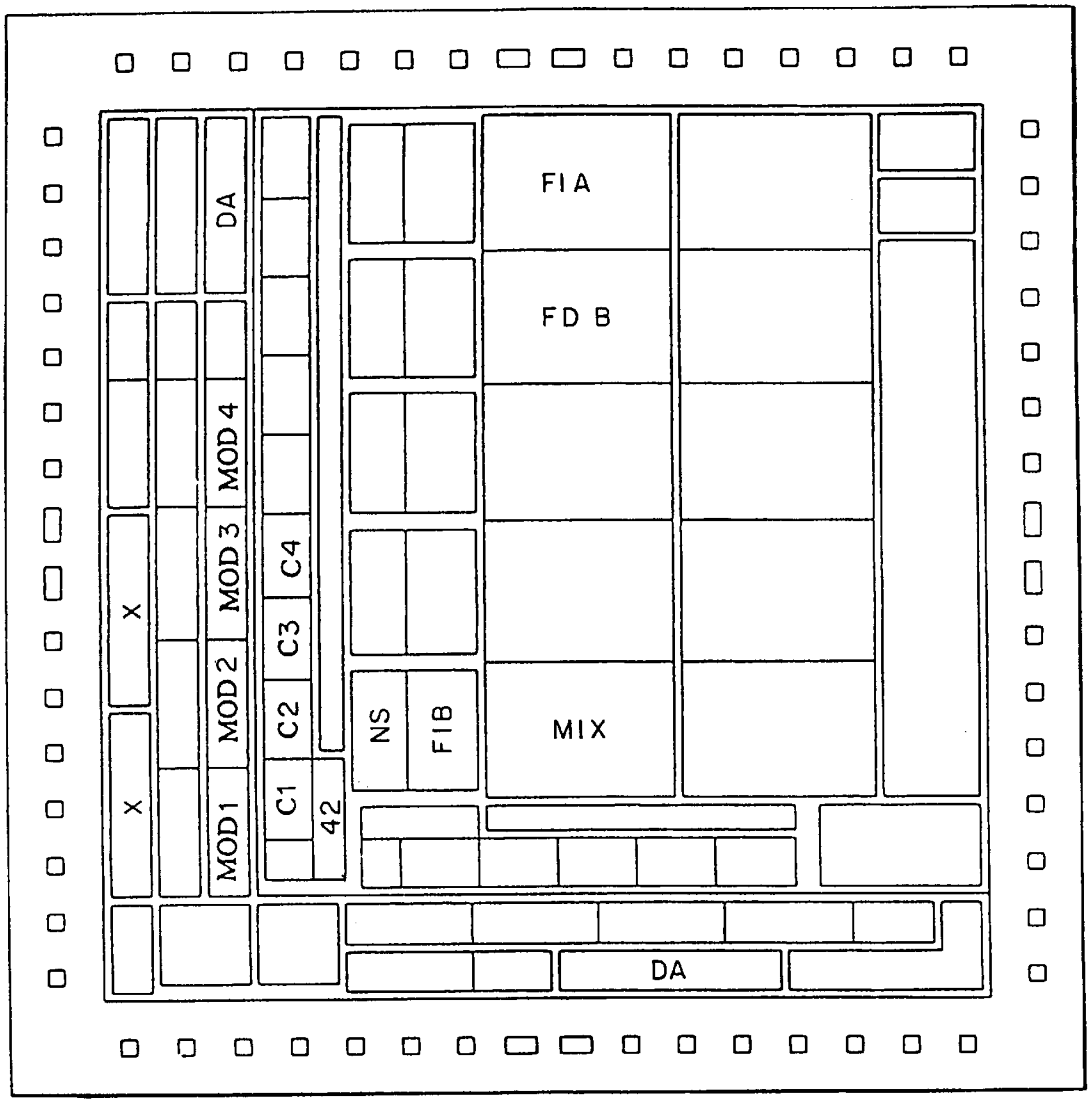
FIG. 6 shows a floorplan of an integrated circuit, including circuitry according to an embodiment of the invention.

FIG. 6 shows a floorplan of an integrated circuit incorporating the functions of FIG. 5, according to the examples described. The surface occupied by the different circuit blocks, designated by the reference labels used in FIG. 5, are drawn to scale. Other circuit blocks, without reference labels, are used to perform other functions or to treat other channels. One block MIX collects together a set of circuit blocks shown in a dotted frame MIX in FIG. 5. This block MIX includes mixers 40 and 48, mute circuits N, gain control circuits X, and the variable attenuator A.

The second decimation filter FDB is the largest of the circuit blocks. According to an embodiment of the invention, a single second decimation filter FDB is used for all of the input channels, which allows a significant saving in semiconductor surface area.

Sixteen bit coding is used in the example discussed above, as this gives sufficient resolution for effective noise elimination, but other coding widths may be used. The decimation and interpolation filters may be implemented in any known form. Additionally, filtering schemes other than finite impulse response and infinite impulse response could just as well be used, as could alternative modulator types.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A signal processing system for mixing a plurality of analog input signals, the signal processing system comprising:

- a plurality of modulators, each having an input that receives a respective one of the plurality of analog input signals and an output that provides a high frequency oversampled digital signal;
- a plurality of first decimation filters, each having an input that receives the high frequency oversampled digital signal from a respective one of the plurality of modulators, and an output that provides an intermediate frequency oversampled multiple bit signal;
- a digital mixer, having an input that receives each intermediate frequency oversampled multiple bit signal, and an output that provides a single mixed multiple bit output signal; and
- a second decimation filter, having an input that receives the single mixed multiple bit output signal, and an output that provides a final digital output signal at a frequency suitable for representing the plurality of analog input signals.

2. The signal processing system of claim 1, further comprising a gain control circuit, coupled between one of the first decimation filters and the first digital mixer, the gain control circuit controlling a gain of the intermediate frequency oversampled signal that is provided by the one of the first decimation filters.

3. The signal processing system of claim 1, wherein each of the plurality of first decimation filters comprises a convolution circuit that processes on the respective high frequency oversampled signal in accordance with a sequence of impulse response coefficients that are common to the convolution circuit of each of the plurality of first decimation filters.

4. The signal processing system of claim 3, further comprising a common memory that stores the sequence of impulse response coefficients.

5. The signal processing system of claim 3, wherein each convolution circuit produces the intermediate frequency oversampled signal by summing coefficients corresponding to 1's of the respective high frequency oversampled signal, and subtracting coefficients corresponding to 0's of the respective high frequency oversampled signal.

6. The signal processing system of claim 1, further comprising:

an interpolation filter having an input that receives the final digital output signal and an output that produces an interpolated signal;

a second digital mixer having an input that receives the interpolated signal and at least one other digital signal, and an output that produces an interpolated mixed digital signal; and a digital-to-analog converter having an input that receives the interpolated mixed digital signal and an output that provides an analog output signal.

7. The signal processing system of claim 6 wherein the digital-to-analog converter comprises:

a low pass filter having an input that receives the interpolated mixed digital signal and output that provides a one bit serial output; and a low pass filter that filters the one bit serial output.

8. The signal processing system of claim 1, further comprising a mute circuit coupled to at least one input of the digital mixer.

9. A method of signal processing, comprising the steps of:

(A) modulating at least two analog signals to produce a high frequency oversampled digital signal for each of the at least two analog signals;

(B) digitally filtering using a first decimation filter each high frequency oversampled digital signal, to produce intermediate frequency oversampled multiple bit signals;

(C) digitally mixing the intermediate frequency oversampled signals to produce a mixed signal at an intermediate frequency; and (D) digitally filtering using a second decimation filter the mixed signal, to produce a final digital output signal, at a frequency suitable for representing the at least two analog signals.

10. The method of claim 9, further comprising the steps of offsetting and detecting zero crossings of the intermediate frequency oversampled multiple bit signals prior to step (C).

11. The method of claim 9, wherein step (B) includes multiplying each high frequency oversampled digital signal by a set of coefficients, the set of coefficients being the same for each high frequency oversampled digital signal.

12. The method of claim 11, wherein step (B) further includes retrieving the single set of coefficients from a single memory device.

13. The method of claim 9, wherein each high frequency oversampled digital signal includes a series of 1's and 0's, and wherein step (B) includes the steps of:

summing a coefficient for each 1 in the series of 1's and 0's; and subtracting a coefficient for each 0 in the series of 1's and 0's, to form the intermediate frequency oversampled multiple bit signals.

14. The method of claim 9, further comprising a step of converting the final digital output signal to an analog signal.

15. The method of claim 9, further comprising a step of muting a selected one of the intermediate frequency oversampled multiple bit signals.

16. An apparatus for signal processing, comprising:

means for modulating at least two analog signals to produce a high frequency oversampled digital signal for each of the at least two analog signals;

first means for digital decimation filtering each high frequency oversampled digital signal, to produce intermediate frequency oversampled multiple bit signals;

means for digitally mixing the intermediate frequency oversampled signals to produce a mixed signal at an intermediate frequency; and second means for digital decimation filtering the mixed signal, to produce a final digital output signal, at a frequency suitable for representing the at least two analog signals.

17. The apparatus of claim 16, further comprising means for offsetting and detecting zero crossings of the intermediate frequency oversampled multiple bit signals to modify the intermediate frequency oversampled multiple bit signals.

18. The apparatus of claim 16, wherein the means for digitally filtering includes means for multiplying each high frequency oversampled digital signal by a set of coefficients, the set of coefficients being the same for each high frequency oversampled digital signal.

19. The apparatus of claim 18, wherein the means for digitally filtering further includes means for retrieving the single set of coefficients from a single memory device.

20. The apparatus of claim 16, wherein each high frequency oversampled digital signal includes a series of 1's and 0's, and wherein the means for digitally filtering includes means for summing a coefficient for each 1 in the series of 1's and 0's and for subtracting a coefficient for each 0 in the series of 1's and 0's, to form the intermediate frequency oversampled multiple bit signals.

21. The apparatus of claim 16, further comprising means for converting the final digital output signal to an analog signal.

22. The apparatus of claim 16, further comprising means for muting a selected one of the intermediate frequency oversampled multiple bit signals.

23. An apparatus comprising:

a plurality of analog to digital converters, each having an input which receives a corresponding one of a plurality of analog signals and an output that provides a corresponding one of a plurality of intermediate digital signals;

a plurality of digital filters, each having an input that receives a corresponding one of a plurality of intermediate digital signals, and an output that provides a filtered output signal;

a digital mixer, having an input that receives the filtered output signal from each of the plurality of digital filters, and an output that provides a digital summation signal; and a decimation filter that receives the digital summation signal and produces a digital signal at a frequency suitable for representing the at least two analog signals.

24. The apparatus of claim 23, wherein each of the plurality of digital filters includes a decimation filter.

25. The apparatus of claim 24, wherein each decimation filter filters the corresponding one of the plurality of intermediate digital signals based upon a same sequence of coefficients.

26. The apparatus of claim 25, further comprising a memory device, coupled to each decimation filter, that stores the sequence of coefficients.

27. The apparatus of claim 23, wherein each of the plurality of analog to digital converters includes a sigma-delta modulator.

28. The apparatus of claim 23, wherein each intermediate signal includes a series of 1's and 0's, and wherein each of the plurality of digital filters includes a circuit that sums a coefficient for each 1 in the series of 1's and 0's and that subtracts a coefficient for each 0 in the series of 1's and 0's.

29. The apparatus of claim 23, further comprising a second decimation filter having an input that receives the digital summation signal and an output that provides a filtered digital output signal.

30. The apparatus of claim 23, further comprising:

a second digital mixer having a first input that receives the filtered digital output signal, a second output that receives a second digital signal, and an output that provides a mixed digital signal; and a digital to analog converter having an input that receives the mixed digital signal and an output that provides an output analog signal.

* * * * *